United States Patent [19]

Matsui et al.

[11] Patent Number: 5,442,545

[45] Date of Patent: Aug. 15, 1995

[54] SYSTEM FOR AUTOMATICALLY MANAGING INFORMATION ABOUT ELECTRONIC EQUIPMENT HAVING PRINTED-CIRCUIT BOARDS

[75] Inventors: Toshinari Matsui; Shigeru Kubo; Kenzo Shimizu; Kunifumi Iwasaki; Koji Kobayashi; Eiko Maruyama, all of Kawasaki, Japan

[73] Assignee: Fujitsu Limited, Kanagawa, Japan

[21] Appl. No.: 852,627

[22] Filed: Mar. 17, 1992

[30] Foreign Application Priority Data

Mar. 18, 1991 [JP] Japan ................................. 3-051948
Mar. 18, 1991 [JP] Japan ................................. 3-051949

[51] Int. Cl.⁶ ...................... G06F 15/00; G06F 15/22; G06F 15/46
[52] U.S. Cl. .................... 364/403; 364/401; 364/468
[58] Field of Search ............... 364/403, 401, 468, 400, 364/478, 479; 29/833, 741, 834

[56] References Cited

U.S. PATENT DOCUMENTS

| | | | |
|---|---|---|---|
| 4,831,543 | 5/1989 | Mastellone | 364/489 |
| 5,025,140 | 6/1991 | Varley | 364/403 |
| 5,204,821 | 4/1993 | Inui et al. | 364/403 |
| 5,237,495 | 8/1993 | Morii | 364/403 |

FOREIGN PATENT DOCUMENTS 298845 12/1987 Japan .

Primary Examiner—Robert A. Weinhardt
Assistant Examiner—X. Chung-Trans

[57] ABSTRACT

A system for automatically managing information about printed-circuit boards includes a data file for storing stock information about the printed-circuit boards stocked in a warehouse, mounting information showing mounting positions of the printed-circuit boards on shelves of equipments, and mounting history information showing results of mounting of the printed-circuit boards. A delivery processing part detects, by referring to the stock information stored in the data file, a fact that all printed-circuit boards necessary to assemble an ordered equipment, and generates a delivery instruction which instructs all the printed-circuit boards to be delivered from the warehouse to an mounting section. A mounting processing part outputs to the mounting section a mounting instruction which instructs the printed-circuit boards delivered from the warehouse to be placed in predetermined positions in the ordered equipment by referring to the mounting information stored in the data file. A mounting information gathering part gathers the mounting history information about the printed-circuit boards placed in the predetermined positions. An output part outputs at least the mounting history information to an output equipment.

11 Claims, 19 Drawing Sheets

| ITEM | SAMPLE |
|---|---|
| SHELF NAME | SLCSHA |
| DRAWING No. | E04B-3012-C002 |
| MANUFACTURED DATE | 90-12 |
| SHELF No. | 1000 |

| PCB NAME | PW56 |
|---|---|
| PCB DRAWING No. | E20B-4514-R660 |
| MANUFACTURED DATE | 90-12 |
| PCB ASSEMBLY MACHINE | 0001 |
| PCB POSITION | 1ST COLUMN |

FIG. 7A

| ITEM | SAMPLE |
|---|---|
| PCB NAME | PW56 |
| PCB DRAWING No. | E20B-4514-R660 |
| PCB DATE | 90-12 |
| PCB No. | 0001 |
| PCB EDITION No. | 05B |
| WAREHOUSED SHELF No. | 6-05-095 |
| WAREHOUSED DATE | 901201 |

FIG. 7B

| ITEM | SAMPLE |
|---|---|
| SHELF NAME | SLCSHA |
| SHELF DRAWING No. | E04B-3012-C002 |
| PRODUCTION No. | D011111NA |
| DESTINATION | XX Fax. STATION |
| PCB POSITION 1 | 1ST COL. |
| PCB NAME 1 | PW56 |
| PCB DRAWING NO. 1 | E20B-4514-R660 |
| ⋮ | |
| PCB POSITION n | nth COL. |
| PCB NAME n | 8SLCB |
| PCB DRAWING No. n | E20B-4514-R000 |

FIG. 7C

| ITEM | SAMPLE |
|---|---|
| SHELF NAME | SLCSHA |
| SHELF DRAWING No. | E04B-3012-C002 |
| PRODUCTION No. | D011111NA |
| APPOINTED DATE | 910120 |
| MANUFACTURED DATE | 90-12 |
| MANUFACTURER'S PART No. | 1000 |
| EDITION No. | 01A |

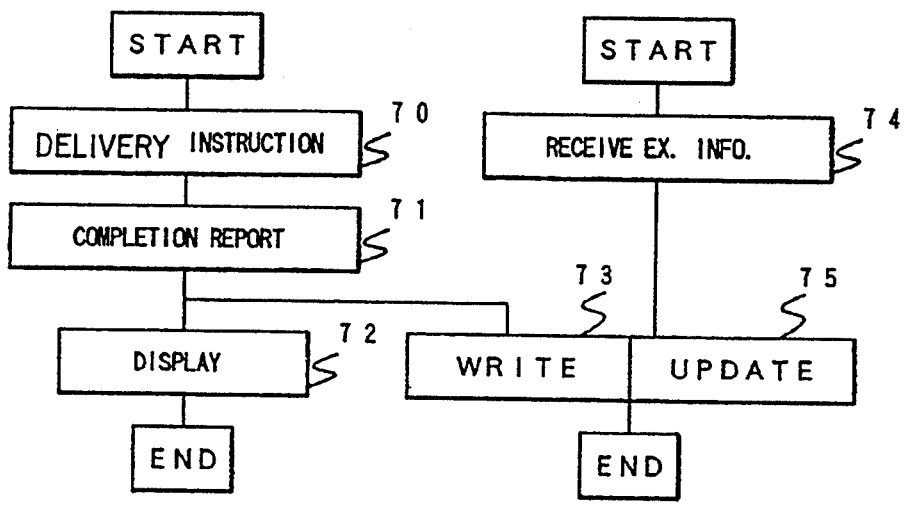

FIG. 10A

| ITEM | SAMPLE |
|---|---|
| PCB NAME | PW56 |
| PCB DRAWING No. | E20B-4514-R660 |
| PCB DATE | 90-12 |
| PCB ASSEMBLY MACHINE | 0001 |
| PCB EDITION No. | 05B |
| SHELF No. | 6-05-95 |
| WAREHOUSED DATE | 901201 |

FIG. 10B

| ITEM | SAMPLE |
|---|---|
| SHELF NAME | SLCSHA |
| SHELF DRAWING No. | E04B-3012-C002 |
| PRODUCTION No. | D011111NA |
| PCB DESTINATION | XX Fax. STATION |
| PCB POSITION 1 | 1ST COL. |
| PCB NAME 1 | PW56 |
| PCB DRAWING No.1 | E20B-4514-R660 |
| ⋮ | ⋮ |
| PCB POSITION n | nth COL. |
| PCB NAME n | 8SLCB |
| PCB DRAWING No. n | E20B-4514-R000 |

FIG. 10C

| ITEM | SAMPLE |
|---|---|
| OLD PCB DRAWING No. | E20B-4514-R660 |
| OLD MANUFACTURED DATE | 90-12 |
| OLD PCB No. | 0001 |
| OLD PCB EDITION No. | 05B |
| NEW PCB DRAWING No. | E20B-4514-R900 |
| NEW PCB DATE | 90-12 |
| NEW PCB No. | 0111 |
| NEW EDITION No. | 06B |

FIG. 10D

| ITEM | SAMPLE |
|---|---|
| SHELF NAME | SLCSHA |
| SHELF DRAWING No. | E04B-3012-C002 |
| PRODUCTION No. | D011111NA |
| APPOINTED DATE | 910120 |
| MANUFACTURED DATE | 90-12 |
| MANUFACTURER'S PART No. | 1000 |
| EDITION No. | 01A |

| SHELF NAME | SLCSHA | No. | D011111NA |
|---|---|---|---|
| SHELF DRAWING No. | E04B-3012-C002 | DESTINATION | XX Fax. STATION No. |
| MANUFACTURE DATE | 90-12 | EDITION No. | 01A |
| MANUFACTURER'S PART No. | 1000 | | |

| SLOT No. | PCB NAME | DATE | DEVICE No. | EDITION No. |
|---|---|---|---|---|
| 1 | PW55 | 90-11 | 0030 | 02A |
| 2 | PW56 | 90-12 | 0001 | 01A |
| 3 | 8SLCA | 90-12 | 0100 | 05B |
| 4 | 8SLCA | 90-12 | 0101 | 05B |
| 5 | 8SLCA | 90-12 | 0102 | 05B |
| 6 | 8SLCA | 90-12 | 0103 | 05B |
| 7 | 8SLCB | 90-12 | 0301 | 08B |
| 8 | 8SLCB | 90-12 | 0302 | 08B |
| 9 | 8SLCB | 90-12 | 0303 | 08B |
| ⋮ | | | | |
| 30 | 8SLCB | 90-12 | 0400 | 08B |
| 31 | PW56 | 90-12 | 0003 | 01A |
| 32 | PW55 | 90-11 | 0031 | 02A |

| ITEM | SAMPLE |
|---|---|
| PCB NAME | PW56 |
| PCB DRAWING No. | E20B-4514-R660 |
| PCB DATE | 90-12 |
| PCB No. | 0001 |
| PCB EDITION No. | 05B |
| SHELF NAME | SLCSHA |
| SHELF DRAWINT No. | E04B-3012-C002 |
| PRODUCTION No. | D011111NA |
| DESTINATION | XX Fax.STATION |
| MANUFACTURED DATE | 90-12 |
| MANUFACTURER'S PART No. | 1000 |
| EDITION No. | 01A |
| PCB POSITION | 1ST COL. |

FIG. 15

| | |
|---|---|
| PCB NAME | PW56 |
| PCB DATE | 90-12 |
| PCB No. | 0001 |
| OLD PCB EDITION No. | 05B |
| NEW PCB EDITION No. | 06C |
| SHELF NAME | SLCSHA |
| SHELF No. | E04B-3012-C002 |
| MANUFACTURE DATE | 90-12 |
| MANUFACTURER'S PART No. | 1000 |
| PCB POSITION | 1ST COL. |

| ITEM | SUMPLE |
|---|---|
| PCB NAME | PW56 |
| PCB DRAWING No. | E20B-4514-R660 |
| PCB DATE | 90-12 |
| PCB No. | 0001 |
| PCB EDITION No. | 05B |
| SHELF NAME | SLCSHA |
| SHELF DRAWING No. | E04B-3012-C002 |
| PPODUCTION No. | D011111NA |
| DESTINATION | XX Fax. STATION |
| MANUFACTURED DATE | 90-12 |
| MANUFACTURER'S PART No. | 1000 |
| EDITION No. | 01A |
| PCB POSITION | 1ST COL. 901222 |

FIG. 16A

| ITEM | SUMPLE |
|---|---|
| PCB NAME | PW56 |
| PCB DRAWING No. | E20B-4514-R660 |
| OLD PCB EDITION No. | 05B |
| NEW PCB EDITION No. | 06C |
| | D011111NA |

FIG. 16B

| PARTS NAME | IC11 |
| LOT CODE | 901A00 |
| SHELF NAME | SLCSHA |
| SHELF DRAWING No. | E04B-3012-C002 |
| No. | D011111NA |
| DESTINATION | XX Fax. STATION |
| MANUFACTURE DATE | 90-12 |
| MANUFACTURER'S PART No. | 1000 |
| EDITION No. | 01A |
| PCB POSITION | 1ST COL. |
| PCB NAME | 8SLCB |
| PCB DRAWING No. | E20B-4514-R000 |
| PCB EDITION No. | 05B |
| PCB DATE | 9012 |
| PCB No. | 0001 |

| ITEM | SAMPLE |
|---|---|
| PARTS NAME | IC11 |
| ACCEPTED DATE | 901121 |
| ACCEPTED NUMBER | 100 |
| ACCEPTED No. | PA01 |
| LOT CODE | 901A00 |

FIG. 22A

| ITEM | SAMPLE |
|---|---|
| LOT CODE | IC11 |
| WAREHOUSE DATE | 901121 |
| WAREHOUSE NUMBER | 1001 |
| ACCEPTED No. | PA01 |
| FORWARD NUMBER | 20 |
| ASSEMBLY No. | NG00001NA |
| PCB NAME | 8SLCB |
| PCB DRAWING No. | E20B-4514-R000 |
| NUMBER OF PCB, | 10 |
| PCB EDITION No. | 05B |

FIG. 22B

| ITEM | SUMPLE |
|---|---|
| PCB NAME | 8SLCB |
| PCB DRAWING No. | E20B-4514-R000 |
| PCB EDITION No. | 05B |
| PCB MANU. MONTH | 9012 |
| PCB ASSEMBLY MACHINE | 0001 |
| SHELF NAME | SLCSHA |
| SHELF DRAWING No. | E04B-3012-C002 |
| PRODUCTION No. | D011111NA |
| DESTINATION | XX Fax. STATION |
| MANUFACTURE DATE | 90-12 |
| MANUFACTURER'S PART No. | 1000 |
| EDITION No. | 01A |
| PCB POSITION | 1ST COL. |

FIG. 22C

| ITEM | SAMPLE |
|---|---|
| ASSEMBLY No. | NG00001NA |
| PCB NAME | 8SLCB |
| PCB DRAWING No. | E20B-4514-R000 |
| PCB EDITION No. | 05B |
| MANUFACTURED MONTH | 9012 |
| MANU. PART No. | 0001 |
| MANU. DATE | 901215 |
| FACTORY | A5 |

FIG. 22D

| PARTS NAME | FAILURE RATE |
|---|---|
| IC11 | 50 |
| IC12 | 8 |
| IC13 | 10 |
| ....... | ... |
| ....... | ... |
| ....... | ... |
| ....... | ... |

| ITEM | SAMPLE |
|---|---|
| PCB NAME | 8SLCB |
| PCB DRAWING NO. | E20B-4514-R000 |
| PCB EDITION NO. | 05B |
| PCB DATE | 9012 |
| PCB ASSEMBLY MACHINE | 0001 |
| SHELF NAME | SLCSHA |
| SHELF RRAWING NO. | E04B-3012-C002 |
| PRODUCTION No. | D0111111NA |
| DESTINATION | ×× FAX STATION |
| MANUFACTURED DATE | 90-12 |
| MANUFACTURER'S PART NO. | 1000 |
| EDITION NO. | 01A |
| PCB POSITION | 1st COL. |
| PARTS NAME | IC11 |
| LOT CODE | 901A00 |

FIG. 26A

| ITEM | SAMPLE |
|---|---|
| PCB NAME | 8SLCB |
| PCB DRAWING NO. | E20B-4514-R000 |
| PCB EDITION NO. | 05B |
| PCB DATE | 9012 |
| PCB ASSEMBLY MACHINE | 0001 |
| SHELF NAME | SLCSHA |
| SHELF RRAWING NO. | E04B-3012-C002 |
| PRODUCTION No. | D0111111NA |
| DESTINATION | ×× EX STATION |
| APPOINTED DATE | 910120 |
| MANUFACTURED DATE | 90-12 |
| MANUFACTURER'S PART NO. | 1000 |
| EDITION NO. | 01A |
| PCB POSITION | 1st COL. |

FIG. 26B

| ITEM | SAMPLE |
|---|---|
| PCB DRAWING NO. | E20B-4514-R000 |
| PCB EDITION NO. | 05B |
| NO. OF USED EQUIPMENT | IC11 01 |

FIG. 26C

SYSTEM FOR AUTOMATICALLY MANAGING INFORMATION ABOUT ELECTRONIC EQUIPMENT HAVING PRINTED-CIRCUIT BOARDS

BACKGROUND OF THE INVENTION (1) Field of the Invention

The present invention generally relates to a system for managing information about electronic equipment having printed-circuit boards, and more particularly to a system for managing information about the stock of structural parts, such as electronic parts and printed-circuit boards, the delivery of the structural parts, the mounting of the electronic parts on equipment frames (shelves), and the shipping of the equipment.

(2) Description of the Prior Art

As is well known, printed-circuit boards on which a large number of electronic parts are mounted are installed in communication devices, such as exchanges, and information processing equipment. In many cases, the finalized printed-circuit boards are mounted on shelves and delivered. The printed-circuit boards may also be called printed wired circuit boards (PWCBs).

Conventionally, the finalized printed-circuit boards are produced by a production process as shown in FIGS. 1(A)–(C). A conventional printed-circuit board production method has a first step of, delivering printed-circuit boards. Printed circuit boards (PCBs) on which electronic parts have been mounted are inserted into predetermined positions of shelves of equipments. The finalized printed-circuit boards are stocked in a finalized printed-circuit board warehouse, and then delivered to an inserting (assembly) step. It takes an extremely long time to check, for each equipment, whether or not all printed circuit boards necessary to produce a printed-circuit board are available in the warehouse, by referring to a diagram showing the names and inserted positions of the printed-circuit board. In order to avoid the above, when it is confirmed that necessary numbers (1, m, . . . , n) of individual printed circuit boards (a, b, . . . , h) produced according to an order which orders a plurality of equipments available in the warehouse, these printed-circuit boards are allowed to be delivered to the subsequent inserting step, as shown in step (A) of FIG. 1.

As Shown on the right-hand side of FIG. 1, the second step of the production process places the delivered printed-circuit boards in predetermined positions in the shelves of the equipments by referring to a specification drawing, and confirms whether or not they are correctly placed in the predetermined positions by referring to the specification drawing.

In the third step (B) of the production process, as shown in FIG. 1(B), the equipments are tested and an operator will see the printed-circuit boards, and records on a recording sheet, which include necessary information about the mounting positions, editions and manufacturer's part numbers of the printed circuit boards. It may be possible to keyboard the necessary information to a computer system.

In the fourth step of the production process, the contents of the printed circuit boards which have been inserted into the shelves are recorded on a shipping list.

In the fifth step (C) of the production process, it is confirmed, by referring to a shipping list as shown in FIG. 1, whether or not each equipment which is about to be shipped to the customer has printed-circuit boards having a requested change of design changed. If it is found that a printed-circuit board which has not been changed is included in the equipment, this equipment cannot be shipped.

However, the first to fifth steps of the conventional production process have the following respective problems. In the first production step, the printed-circuit boards are not delivered to the inserting step until all the printed-circuit boards are prepared and stocked in the warehouse. Thus, it is difficult to efficiently arrange the inserting step and subsequent steps. Particularly, it is very difficult to reduce the periods of the inserting step and subsequent steps.

In the second production step, it is manually checked whether or not the printed circuit boards are correctly placed in the predetermined positions on the shelves of the equipments. Thus, this manual checking procedure does not have a high reliability. Further, the manual checking procedure needs a large number of drawings.

In the third production step, the necessary information is manually recorded on the recording sheets. Hence, this manual recording procedure does not have a high reliability. If it is desired to input the necessary information to a computer system, the keyboarding operation is needed at this time.

The fourth production step needs a large working load, and has a high possibility that the contents of the printed-circuit boards are erroneously recorded on the shipping list.

In the fifth production step, it is determined, by manually referring to the change-of-design list, whether or not each equipment can be shipped. Hence, there is a high possibility that an equipment having a printed-circuit board which has not been changed may be shipped.

SUMMARY OF THE INVENTION

It is a general object of the present invention to eliminate the above problems.

A more specific object of the present invention to provide a system for automatically managing information about electronic parts, such am resistors, capacitors, ICs, and printed-circuit boards, such information including information about the delivery of electronic parts from a warehouse to a subsequent production step, mounting the electronic parts on equipments, managing the particulars of mounting the electronic parts, creating a shipping list and checking whether or not each equipment can be shipped.

The above objects of the present invention are achieved by a system for automatically managing information about printed-circuit boards, comprising:

data file means for storing stock information about the printed-circuit boards stocked in a warehouse, mounting information showing mounting positions of the printed-circuit boards on shelves of equipments, and mounting history information showing results of mounting of the printed-circuit boards;

delivery processing means, coupled to the data file means, for detecting, by referring to the stock information stored in the data file means, that all printed-circuit boards necessary to assemble an ordered equipment, are available and for generating a delivery instruction which instructs all the printed-circuit boards to be delivered from the warehouse to a mounting section;

mounting instruction processing means, coupled to the data file means and the delivery processing means, for outputting to the mounting section a mounting instruction which instructs the printed-circuit boards delivered from the warehouse to be placed in predetermined positions in the ordered equipment by referring to the mounting information stored in the data file means;

mounting history information gathering means, coupled to the mounting processing means, for gathering the mounting history information about the printed-circuit boards placed in the predetermined positions; and output means, coupled to the data file means, for outputting at least the mounting history information to an output equipment.

BRIEF DESCRIPTION OF THE DRAWINGS

Other objects, features and advantages of the present invention will become more apparent from the following detailed description when read in conjunction with the accompanying drawings, in which:

FIGS. 7A, 7B and 7C diagrammatically show examples of data information used in the process shown in FIG. 5;

FIG. 8 is a flowchart of a process of shipping equipments to a customer and replacing a printed-circuit board which has been placed in an equipment with another one;

FIGS. 9A and 9B diagrammatically show examples of output data used in the process shown in FIG. 8;

FIGS. 10A through 10D show examples of input data used in the process shown in FIG. 8;

FIG. 15 is a diagram showing an example of output data which is displayed when the edition number is changed;

FIGS. 16A and 16B are diagrams showing of input data used in the shipping decision process;

FIGS. 22A through 22D show examples of input data used in the process shown in FIG. 20;

FIGS. 26A, 26B and 26C show examples of input data used for calculating the failure rate.

DESCRIPTION OF THE PREFERRED EMBODIMENTS

Figure 1:
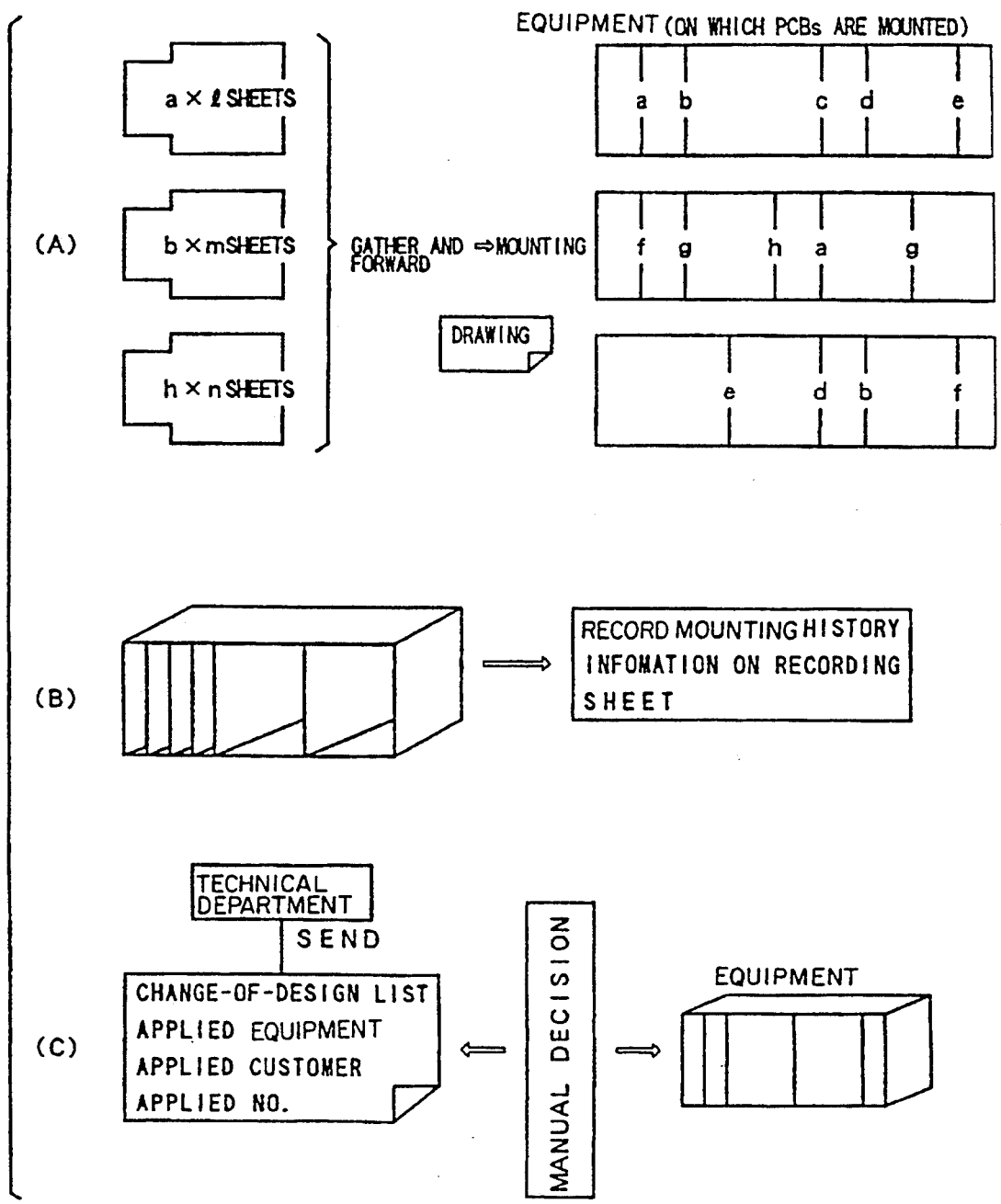
FIG. 1 is a diagram showing an conventional electronic parts management system.
Figure 2:
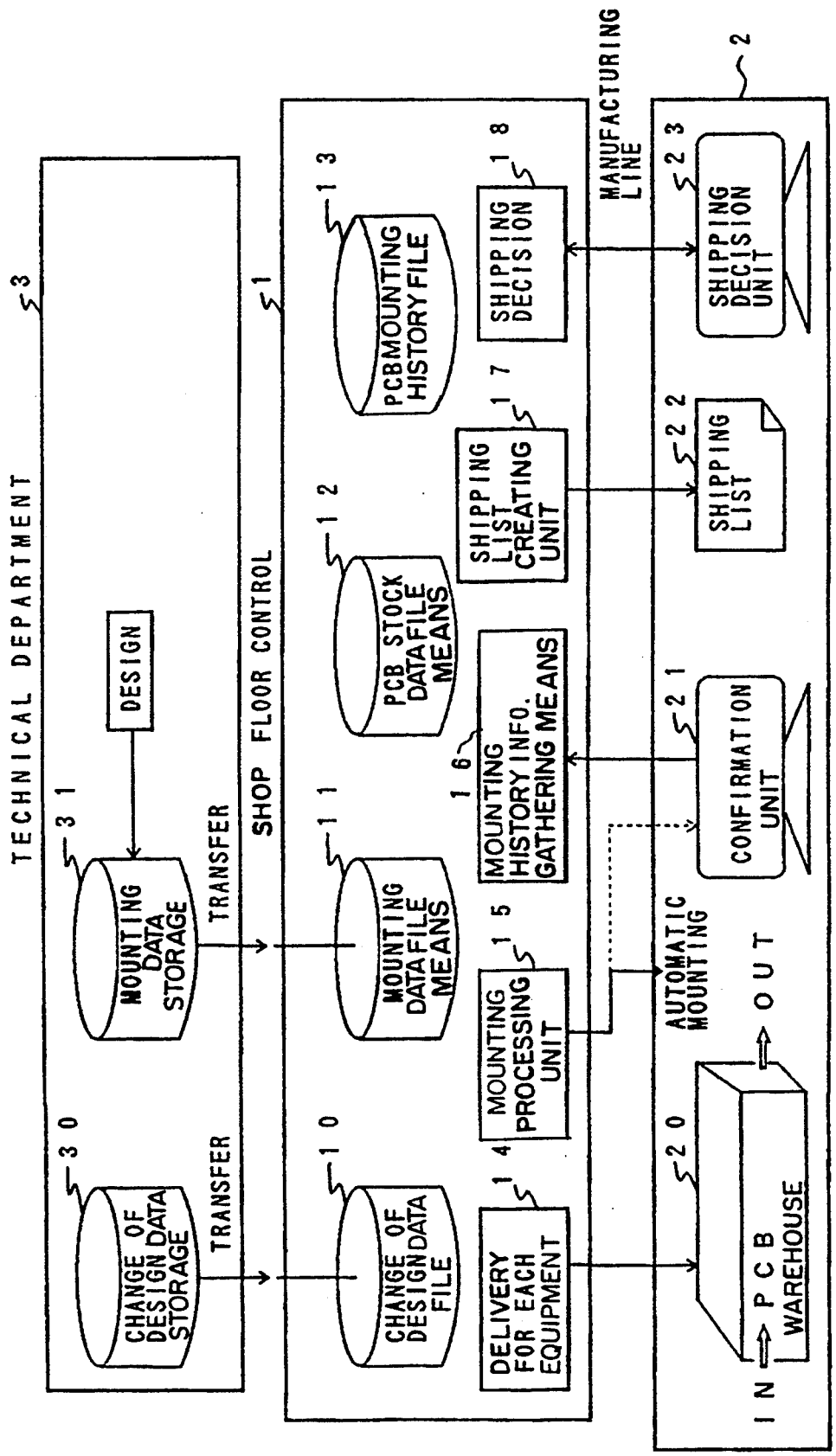
FIG. 2 is a block diagram of an outline of a first embodiment of the present invention.

FIG. 2 shows an outline of an automatic management system according to a first embodiment of the present invention. The system includes a shop floor control system 1, a manufacturing department (manufacturing line) 2, and a technical department 3. The shop floor control system I and the manufacturing department 3 are located in a factory. The technical department 3 inputs design data about the specifications of equipments and data showing a change of design. In order to store the above data, the technical department 3 includes storage devices 30 and 31. The storage device 31 stores data about the specifications of the equipments, and the storage device 30 stores data about a change of design. The shop floor control system 1 receives the data from the technical department 3, and gathers information generated at each production step performed in the manufacturing department 2. Then, the shop floor control system 1 executes predetermined processes, and outputs necessary information to the manufacturing department 2. The production manufactures department 2 executes a printed-circuit board stocking step, a mounting step, and a shipping step.

The shop floor control system 1 includes a change-of-design data file 10, a mounting data file 11, a printed-circuit board stock data file 12, a printed-circuit board mounting history data file 13, a delivery processing unit 14 for controlling delivery for each equipment, and a mounting processing unit 15 for controlling the mounting printed-circuit boards on each equipment. Further, the shop floor control system 1 includes a mounting history information gathering processing unit 16 for gathering information showing which printed-circuit boards are mounted on each equipment, a shipping list creating unit 17, and a shipping decision unit 18.

The manufacturing department 2 includes a warehouse 20 for stocking finalized printed-circuit boards, a mounting position confirmation unit 21, a shipping list, 22, and a shipping decision confirmation unit 23.

The technical department 3 designs equipments according to an order of a customer, and stores mounting data (mounting data showing an arrangement of printed-circuit boards which are to be mounted on each equipment) in the storage device 31. If a change of design is requested, data about this change of design is stored in the storage device 30. The data are read out from the storage devices 30 and 31, and written into the files 10 and 11, respectively. The finalized printed-circuit boards are carried into the warehouse 20, and stocked therein. The contents of the printed-circuit board stock data file 12 are updated each time carry-in/delivery data is supplied to the shop floor control system 1.

The delivery processing unit 14, which controls a delivery process for each equipment, compares the contents of the data file 12 with the contents of the mounting data file 11, and determines, for each equipment, whether or not all the finalized printed-circuit boards necessary to assemble the equipment being considered are stocked in the warehouse 20. When the result of this determination is affirmative, the delivery processing unit 14 generates an instruction to deliver the finalized printed-circuit boards necessary to assemble the equipment being considered to a section executing a printed-circuit board mounting step. The above instruction is sent to the warehouse 20 by means of a printer or display installed in the manufacturing department and/or the shop floor control system 1. A mounting section receives the printed-circuit boards from the warehouse 20 and assembles the equipment.

The mounting processing unit 15 in the shop floor control system 1 reads out data indicative of the mounting positions of the printed-circuit boards from the data file 11 and outputs the readout data to the mounting position confirmation unit 21. By referring to the received data, the printed circuit boards are automatically or manually placed in the specified positions in the equipment. When the mounting is started or it is confirmed that all the printed circuit boards have been mounted, the mounting history information gathering processing unit 16 is activated. Then, the unit 16 stores, in the printed-circuit board mounting history data file 13, either printed-circuit board mounting information (stored in the data file 11) or mounting information which is input during the mounting confirmation procedure.

When the assembly of the equipment has been completed, the shipping list creating unit 17 of the shop floor control system 1 is activated. The shipping list creating unit 17 creates, a shipping list 22 by using the data in the printed-circuit board mounting history data file 13. The shipping decision unit 18 decides, for each customer, whether or not the completed equipment can be shipped. In this decision step executed for each customer, the change-of-design data stored in the data file 10 is compared with the data stored in the printed-circuit board mounting history data file 13 in order to confirm matching between the edition shown by the data in the file 10 and the edition shown by the data in the file 13. If both the editions do not match each other, a printed-circuit board of interest is replaced with a correct one. Information showing this replacement is the data file 13, which is then updated.

Figure 3:
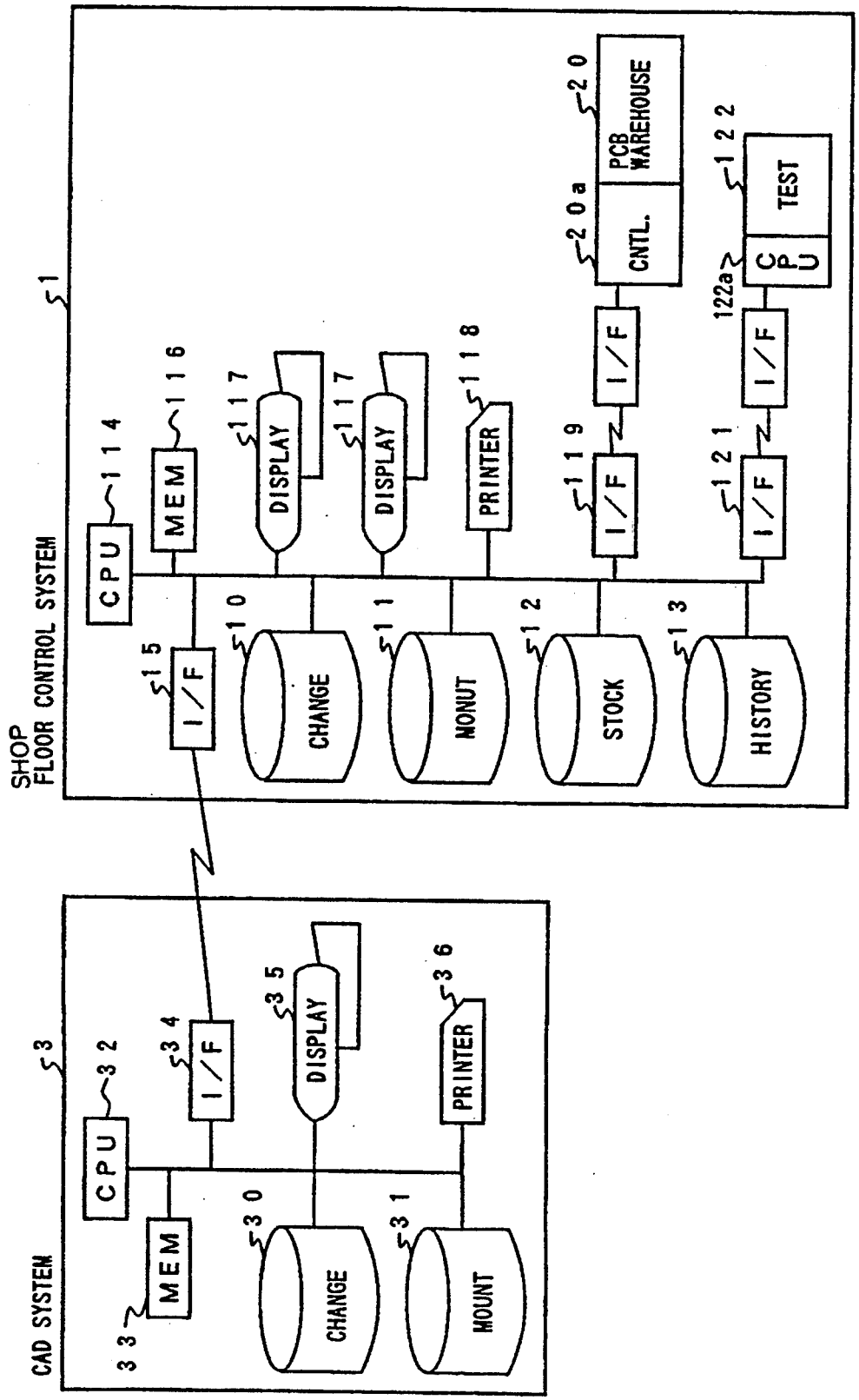
FIG. 3 is a block diagram of a hardware structure of the first embodiment of the present invention.

FIG. 3 shows a hardware structure of the first embodiment of the present invention. In FIG. 3, parts which are the same as those shown in FIG. 2 are given the same reference numerals. The structural elements of the shop floor control system 1 shown in FIG. 2 are configured as shown in FIG. 3. The shop floor control system 1 includes a central processing unit (CPU) 114, an interface (I/F) 115 communicating with the technical department 3, a memory 116 storing programs and data, terminal equipments 117 having respective display units, a printer 118, an interface (I/F) 119 communicating with a controller 20a of the warehouse 20, a test device 122, and an interface (I/F) 121 communicating with a CPU 122a of the test device 122.

The technical department 3 has a CAD (Computer-Aided Design) system, which comprises a CPU 32, a memory 33, an interface (I/F) 34, a terminal equipment 35 having a display unit, and a printer 36.

Figure 4:
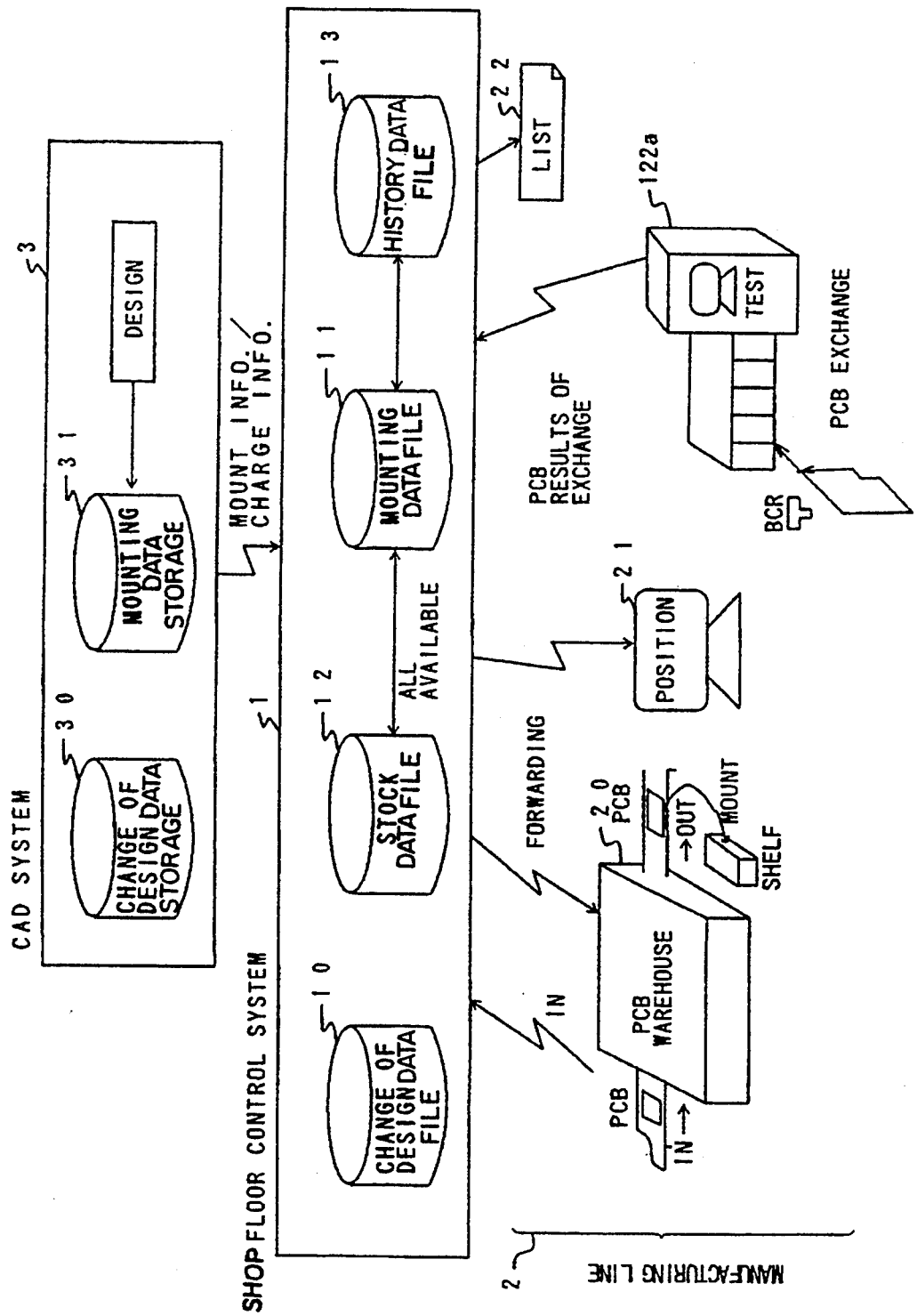
FIG. 4 is a block diagram showing an outline of a system operation of the first embodiment of the present invention.

FIG. 4 is a diagram of an outline of the automatic management system shown in FIG. 3. In FIG. 4, those parts which are the same as those shown in the previous figures are given the same reference numerals. The data about the printed-circuit boards put in storage is automatically gathered in the data file 12, and checked by a procedure executed by the shop floor control system 1, as will be described in detail later. When it is confirmed, by referring to the stock data, that all the printed-circuit boards necessary to assemble an equipment are available, an instruction to deliver the printed-circuit boards to the mounting (assembly) section is output to the controller 20a of the warehouse 20.

When data showing the mounting positions of the printed-circuit boards is generated by the shop floor control system 1 this is displayed on the terminal equipment 121. If a conventional automatic mounting apparatus (not shown for the sake of simplicity) is used, the printed-circuit boards are automatically placed in the positions specified by the data showing the mounting positions.

The actual mounting positions of the printed-circuit boards are confirmed and an input signal indicating this confirmation is input via the terminal equipment 121. In response to the above input signal, the printed-circuit board mounting history data is stored in the data file 13. The procedure for gathering the mounting history data may be carried out by means of the test apparatus 122.

The test apparatus 122 carries out a predetermined test operation and identifies a defective printed-circuit board. If such a defective printed-circuit board is identified, it is replaced with a normal printed-circuit board. Data about this replacement is written into the printed-circuit board mounting history data file 13, so that it is updated. After the test operation has bean completed, the shipping list 22 is output by using the data stored in the printed-circuit board mounting history data file 13.

The test apparatus 122 determines, for each customer, whether or not each of the printed-circuit boards installed in the equipment has the ordered specification, and whether or not each of the printed-circuit boards installed in the equipment has a requested change in the specification. If the result of the above determination is negative, each printed-circuit board identified by the above determination procedure is replaced with a correct printed-circuit board. The data indicative of this replacement is sent to the printed-circuit board history data file 13 so that it is updated. When it is confirmed that all the printed-circuit boards are correctly placed in the equipment, the equipment is allowed to be shipped.

Figures 5, 6A, 6B:
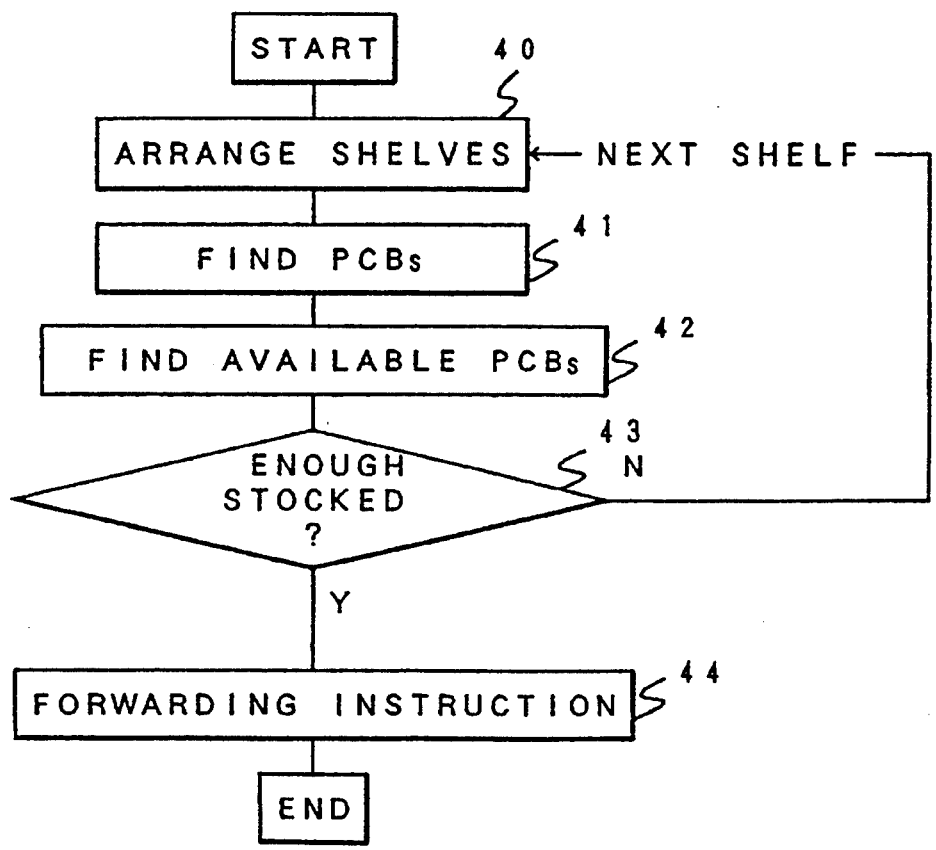
FIG. 5 is a flowchart of a process of delivering printed-circuit boards from a warehouse to a subsequent manufacturing step in which the printed-circuit boards are mounted on an equipment.
FIGS. 6A and 6B diagrammatically show examples of output data processed during the delivery procedure.

A description will now be given, with reference to FIGS. 5, 6 and 7, of a process for realizing the above-mentioned operation and data structures used therein. FIG. 5 is a flowchart of a process of delivering the printed-circuit boards necessary to assemble an equipment. The process shown in FIG. 5 is executed for each equipment. FIG. 6 is a diagram showing data used for instructing the delivery instruction to the controller 20a of the warehouse 20. FIGS. 7A, 7B and 7C show information data used in the process shown in FIG. 5.

A program defining the process shown in FIG. 5 is stored in the memory 116 and executed by the CPU 114 shown in FIG. 3. The process shown in FIG. 5 is used when the printed-circuit boards are delivered to the assembling step on the basis of information about the equipment in which the delivered printed-circuit boards are placed. Such information about the equipment is generated on the basis of the data stored in the mounting data file 11.

At step 40 shown in FIG. 5, shelves (into which printed-circuit boards are inserted) are arranged in order of dates of delivery by using the equipment information. The equipment information is as shown in FIG. 7(C). For each shelf, the equipment information contains information about predetermined items including a shelf name, a shelf drawing number, the appointed date of delivery, the manufacturer's part number, the shelf production date, and so on. The shelves are arranged in order of dates of delivery contained in the equipment information. If an automatic mounting device is used, the shelves are automatically arranged in order of dates of delivery.

At step 41 of FIG. 5, printed circuit boards respectively used for the shelves are identified by referring to the information stored in the mounting data file 11. The mounting information is as shown in FIG. 7(B). For each shelf, the mounting information contains information about items including the shelf name ("SLCSHA" in the example shown in FIG. 7(B)), a manufacturing number, a destination of delivery, and mounting positions of the printed-circuit boards. By referring to the mounting information as shown in FIGS. 7A–7C information pieces relating to all the necessary printed-circuit boards having the shelf name selected at step 40 are extracted from all the information pieces.

At step 42 of FIG. 5, it is determined, by referring to the stock information stored in the printed-circuit board stock data file 12, whether or not a necessary number of printed-circuit boards having the specified name are available. FIG. 7(A) shows an example of the stock information, which indicates that one printed-circuit board having the mounting information shown in FIG. 7(B) is available in the warehouse 20. At step 43, It is determined whether or not all the printed-circuit boards necessary to assemble the equipment are available. When the result of this determination is negative, step 40 is executed and a sequence of steps 40–34 is carried out for the next shelf. When the result of the decision made at step 43 is affirmative, the controller 20a of the warehouse 20 is instructed to deliver all the necessary printed-circuit boards.

FIG. 6(A) shows output data containing the equipment information of a shelf which is scheduled to be assembled. FIG. 6(B) shows output data showing information about the printed-circuit boards which are instructed to be delivered from the warehouse 20.

FIG. 8 is a flowchart of a procedure for processing the printed-circuit board mounting history data and a procedure for replacement of printed-circuit boards. FIGS. 9A and 9B show examples of output data obtained by executing the process shown in FIG. 8. FIGS. 10A, 10B, 10C and 10D show examples of input data used in the process shown in FIG. 8.

The printed-circuit board delivery process shown in FIG. 8 is different from that shown in FIG. 5 in that the process shown in FIG. 8 does not generate the delivery instruction for each equipment, but generates the delivery instruction for printed-circuit boards necessary for an equipment to be assembled. In the process shown in FIG. 8, the delivery instruction is generated for each printed-circuit board necessary to assemble the equipment, and each printed-circuit board is mounted on the equipment each time one printed-circuit board is delivered.

At step 70 of the printed-circuit board delivery process shown in FIG. 8, the delivery instruction to deliver a printed-circuit board is sent to the controller 20a of the warehouse 20. By referring to the equipment information shown in FIG. 10(D), a shelf (equipment) which is to be assembled is determined. Then, printed-circuit boards necessary to assemble the equipment are identified by referring to the mounting information (information stored in the mounting data file 11) as shown in FIG. 10(B). Thereafter, it Is determined whether or not a necessary number of the identified printed-circuit boards is available by referring to the stock information shown in FIG. 10(A). When it is confirmed that the necessary number of the identified printed-circuit boards is available, the delivery instruction is sent to the controller 20a of the warehouse 20.

At step 71 shown in FIG. 8, a confirmation signal is received which shows that the requested printed-circuit boards have been completely delivered from the warehouse 20. After the confirmation signal has been received, two steps are executed. At step 72, data showing the mounting positions of the printed-circuit boards is displayed. The displayed data is based on the mounting position information contained in the mounting information shown in FIG. 10(B). At the same time as step 72, step 73 is performed at which step the mounting history information stored in the data file 13 shown in FIG. 3 is updated in response to receipt of the confirmation signal.

The printed-circuit board replacement process shown in FIG. 8 is performed when a defective printed-circuit board is found or an edition mismatching between the actually mounted printed-circuit board and the ordered printed circuit board takes place. At step 74, replacement information showing that an actually mounted printed-circuit board is replaced by another one is received. At step 75, the contents of the mounting history data file 13 shown in FIG. 3 are changed.

FIG. 9(A) shows displayed output data showing the mounting positions of the printed-circuit boards which were delivered in response to the delivery instruction. FIG. 9(B) shows an example of output data which is written into the mounting history data file 13.

Figures 11, 12:
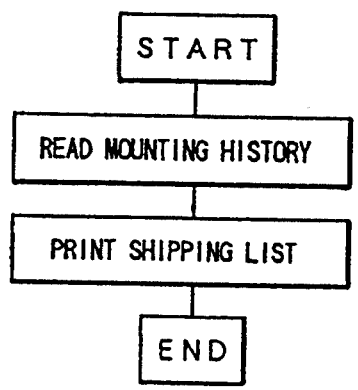
FIG. 11 is a flowchart of a process of creating a shipping list.
FIG. 12 is a diagram showing an example of the shipping list.
Figures 13, 14:
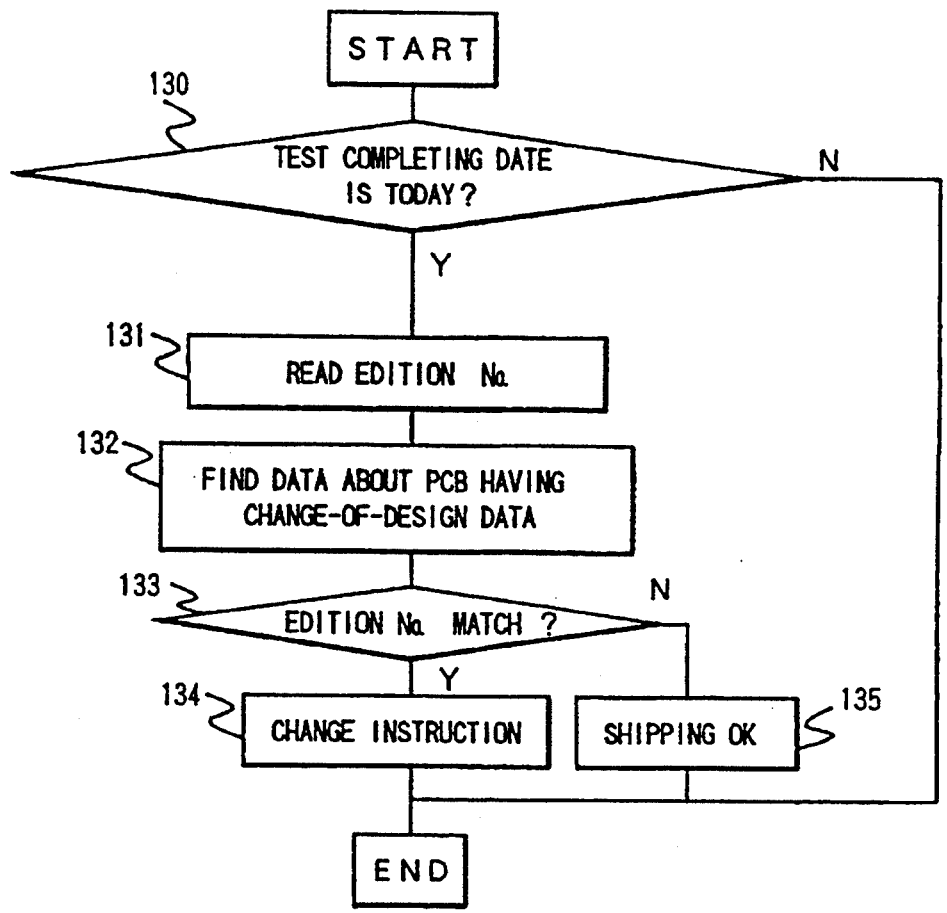
FIG. 13 is a diagram showing an example of input data used for creating the shipping list.
FIG. 14 is a flowchart of a process of determining whether or not each equipment can be shipped.

FIG. 11 is a flowchart of a process for creating the shipping list 22. FIG. 12 shows an example of the shipping list 22. FIG. 13 shows an example of input data used when the shipping list 22 is created.

In the process shown in FIG. 11, the mounting history information is read, and the shipping list 22 is printed out. The printed-out mounting history information is the contents of the printed-circuit board mounting history data file 13 shown in FIG. 3.

FIG. 14 shows a shipping decision process. FIG. 15 shows an example of displayed output data created when the edition number is changed. FIGS. 16A and 16B show examples of input data used in the shipping decision process shown in FIG. 14.

At step 130 shown in FIG. 14, it is determined whether or not a test completion data is the appointed day. When the result of this determination is negative, the process ends. When the result of this determination is affirmative, step 131 is executed at which step the edition number of the printed-circuit board is read. An example of the content of the printed-circuit board mounting history data file 13 is shown in FIG. 16(A). The edition number shown In FIG. 16(A) is "05B". At step 132, data about the printed-circuit board having change-of-design data is found in the mounting history file 13. FIG. 16(B) shows an example of the change-of-design data (see reference 10 shown in FIG. 3). At step 133, the edition number of the printed circuit board to which a change of design is requested with the edition number defined in the data defined in the mounting history file 13. When the result of this determination is affirmative, an instruction to change the edition number is generated at step 134. The printed-circuit board having the old edition is changed with a new printed-circuit board having a latest edition. When the result obtained at step 133 is negative, it is determined that the equipment can be shipped.

In the example shown in FIG. 16B, the name, the old edition number, and the manufacturer's part number of the printed-circuit board coincide with those shown in FIG. 16(A). Hence, the instruction to change the edition number is generated at step 134. The data displayed in this case is shown in FIG. 15. When the data shown in FIG. 15 is displayed, the old printed-circuit board is replaced with a new printed-circuit board having the latest edition number.

The first embodiment of the present invention provides the following advantages. Firstly, it is possible to prevent a large number of printed-circuit boards from being delivered from the warehouse at one time and hence even up a load of the assembling step and reduce the time necessary to prepare the necessary printed-circuit boards. Secondly it becomes possible to efficiently place the printed-circuit boards in the predetermined positions without referring to the drawings. Thirdly it becomes possible to efficiently gather the printed-circuit board mounting history information. It also becomes possible to efficiently and precisely create the shipping list. And finally it becomes possible to facilitate the procedure for confirming the edition number and hence facilitate the exchange procedure.

A description will now be given of a second embodiment of the present invention. The second embodiment of the present invention is intended to obtain a failure rate of electronic parts which are to be mounted on a printed-circuit board and a failure rate of printed-circuit boards and to easily identify the products having defective electronic parts or printed-circuit boards.

Figure 17:
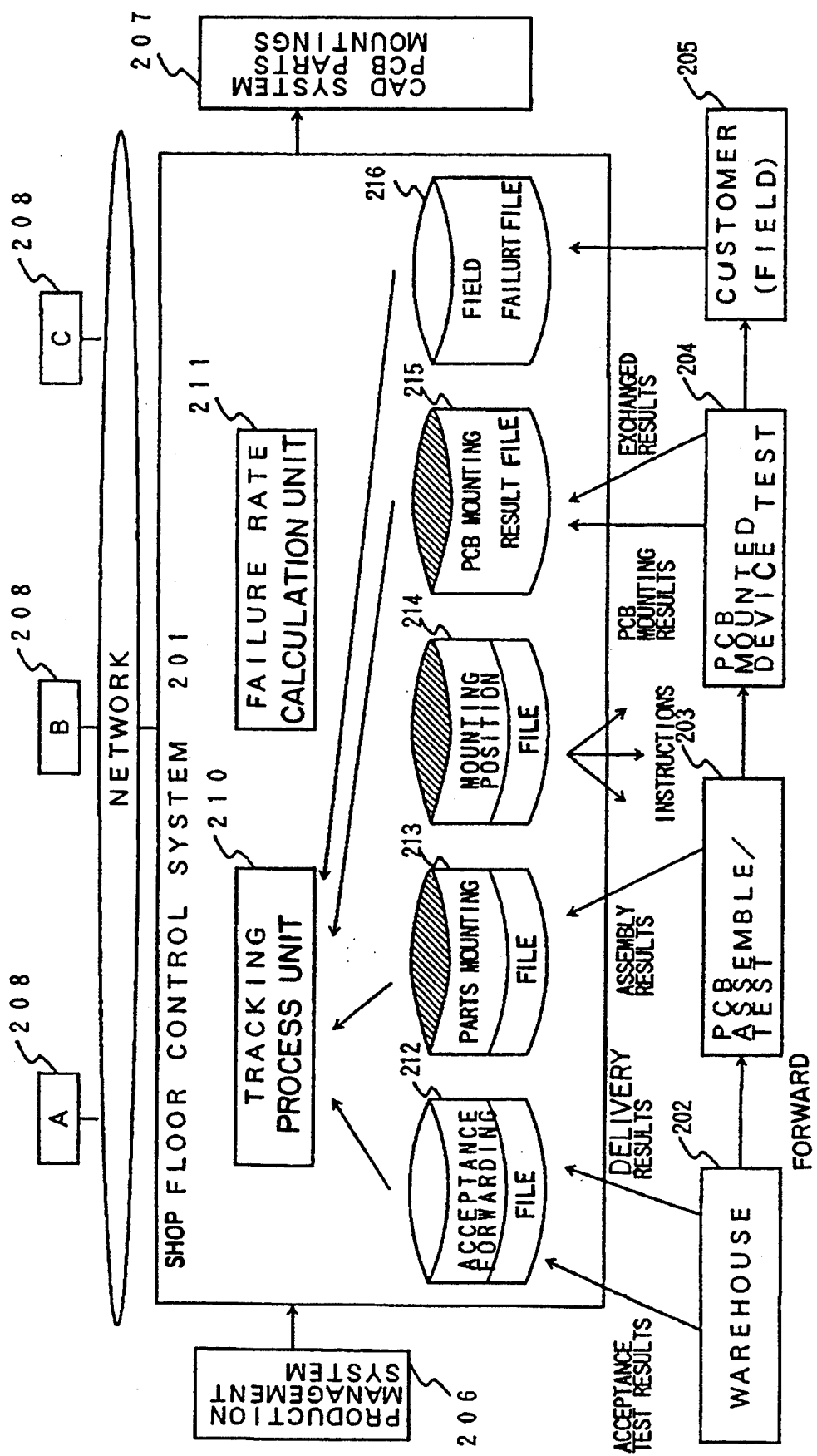
FIG. 17 is a block diagram of an outline of a second preferred embodiment of the present invention.

FIG. 17 shows an outline of an automatic management system according to the second embodiment of the present invention. The automatic management system shown in FIG. 17 includes a shop floor control system 201 formed in a factory. The shop floor control system 201 comprises a tracking processing unit 210 for managing quality information, a failure rate calculation unit 211, a warehouse data file 212 for storing data about stocked electronic parts, a printed-circuit board manufacturing data/parts mounting data file 213, an order/printed-circuit board mounting position data file 214, a printed-circuit board mounting result file 215 and a field failure file 216.

On the factory side, there are provided a warehouse 202 for stocking electronic parts, a printed-circuit board assembling and testing department 203, and a printed-circuit board mounting and equipment testing department 204. Reference numeral 205 indicates a facility on a customer side to which the products are delivered. A production management system 206 is connected to the shop floor control system 201 and a network. A CAD system 207 which is connected to the shop floor control system 201 and the network, helps to design the mounting of printed-circuit boards and equipments. Manufacturing points 208 (A,B,C) are connected to the network.

The second embodiment of the present invention manages a mounting history of printed-circuit boards as well as a list of structural parts mounted on the printed-circuit boards. By referring to the above information and field failure data generated when a failure has occurred, it becomes possible to recognize the type of a defective equipment and the failure rate of each electronic part. In addition, it becomes possible to identify products which have defective parts when a lot failure has occurred.

Data indicative of an order is input to the shop floor control system 201 from the production management system 206, and design data about electronic parts, mounting of electronic parts on printed-circuit boards, and assembling equipments using the printed-circuit boards. By using the above data, the shop floor control system 201 creates the order/printed circuit board mounting position data file 214. The created data is supplied to the manufacturing points 208 in the factory as instruction information.

The warehouse 202 stocks electronic parts necessary to assembly the ordered equipment after they are checked. Then, the electronic parts are delivered from the warehouse 202 to the printed-circuit board assembling and testing department 203. Data showing accepted and delivered parts as well as data showing the results of the above check operation are transferred to the data file 212 and stored therein.

The printed-circuit board assembling and testing department 203 mounts the electronic parts delivered from the warehouse 202 on printed-circuit boards, and the assembled printed-circuit boards are tested. Thereafter, the printed-circuit boards are stocked in a warehouse in the department 203. Data obtained during the assembling and testing process is stored in the data file 213. Then, the assembled printed-circuit boards are inserted in the shelves in the printed-circuit board mounting and testing department 204. During the mounting and testing procedure, if a defective printed-circuit board is detected, a printed-circuit board is misplaced or a different type of printed-circuit board is placed, a correct printed-circuit board is substituted therefor. Data showing the result of the mounting of the printed-circuit boards and data about the replacement are sent, as field failure information, to the shop floor control system 201 and stored in the data file 215.

When a failure has occurred in the facility on the customer's side, field failure information is sent to the shop floor control system 201 and stored in the field failure data file 216. The tracking processing unit 210 in the field control system 201 refers to the data files 212, 213, 215 and 216, and searches for necessary data.

That is, when a part lot failure or a manufacturing defect has occurred, the tracking processing unit 210 refers to the data files 212, 213, 215 and 216, and determines which equipments have such a failure or defect, which positions these equipments are located in, and how many equipments have been delivered. By using the field failure information and referring to the contents of the data files 212-215, the failure rate calculation unit 211 calculates the failure rate of equipments of an identical type as well as the failure rate of each printed-circuit board.

Figure 18:
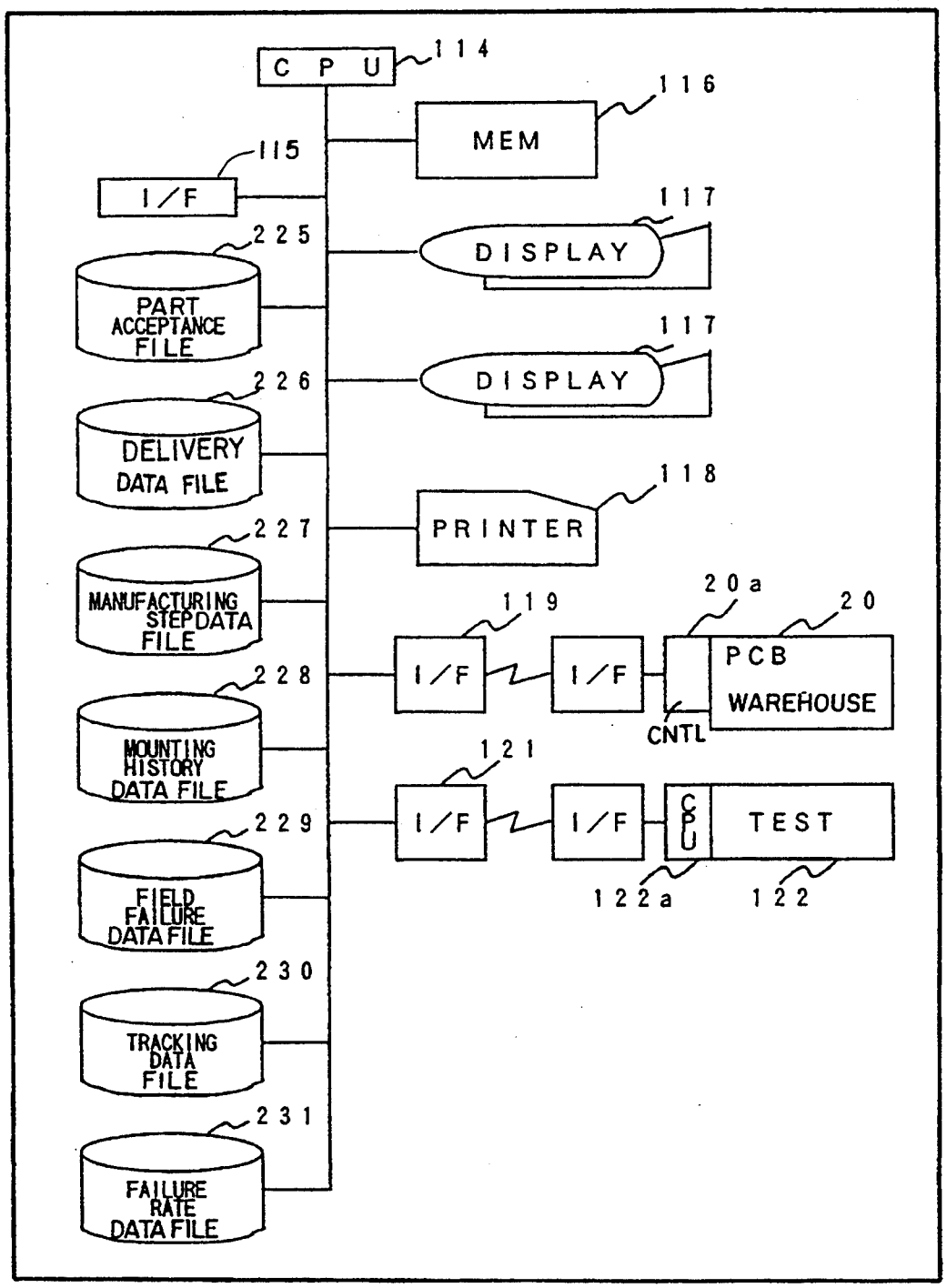
FIG. 18 is a block diagram of a hardware structure of the second embodiment of the present invention.

FIG. 18 is a block diagram of a hardware structure of the second embodiment of the present invention. The shop floor control system 201 comprises aforementioned CPU 114, interface 115, the memory 116, two terminals 117 having displays, printer 118, interfaces 119 and 121, warehouse 20 controlled by controller 20a, and the test apparatus 122 controlled by CPU 122a. Further, the shop floor control system 201 comprises a parts acceptance data file 225, a parts delivery data file 226, a manufacturing step data file 227, a mounting history data file 228, a field failure data file 229, a tracking data file 230, and a failure rate data file 231.

A tracking process carried out by the second embodiment of the present invention will now be described with reference to FIG. 19. A parts acceptance process 336 is carried out, and data generated during the parts acceptance process 336 is stored in the data file 225 and then transferred to a tracking process part 210 implemented by the CPU 114. The above data shows the name of the accepted parts, a lot code, the number of the accepted parts. The accepted parts are then stocked in the warehouse 20. Data on the received parts is stored in the data file 226 under the control of a warehousing process 337. When the parts are delivered from the warehouse 20, data indicative of the delivered parts is stored in the data file 226 under the warehousing process 337.

The parts from the warehouse 20 are delivered to the printed-circuit board assembling (parts mounting) section. In this section, parts are mounted one the printed-circuit boards. Data on this mounting process, such as the edition number and the manufacturers part number of the assembled printed-circuit boards, is stored in the data file 227 under the control of a printed-circuit board manufacturing process 338. The assembled printed-circuit boards are housed in a printed-circuit board warehouse. Data on the warehousing of the printed-circuit boards is stored in the data file 228 under the control of an equipment assembling (board mounting) process 339. Then, the printed-circuit boards are mounted on the equipments. During this mounting process, data showing the results of the mounting process is generated and stored in the data file 228 under the control of the equipment assembling process 339. If it is determined, by the test, that a printed-circuit board which has been mounted on the equipment should be replaced with another printed-circuit board, this replacement is executed and data indicatives of the old and new printed-circuit boards is stored in the data file 228 under the control of the equipment assembling process 339.

Figure 19:
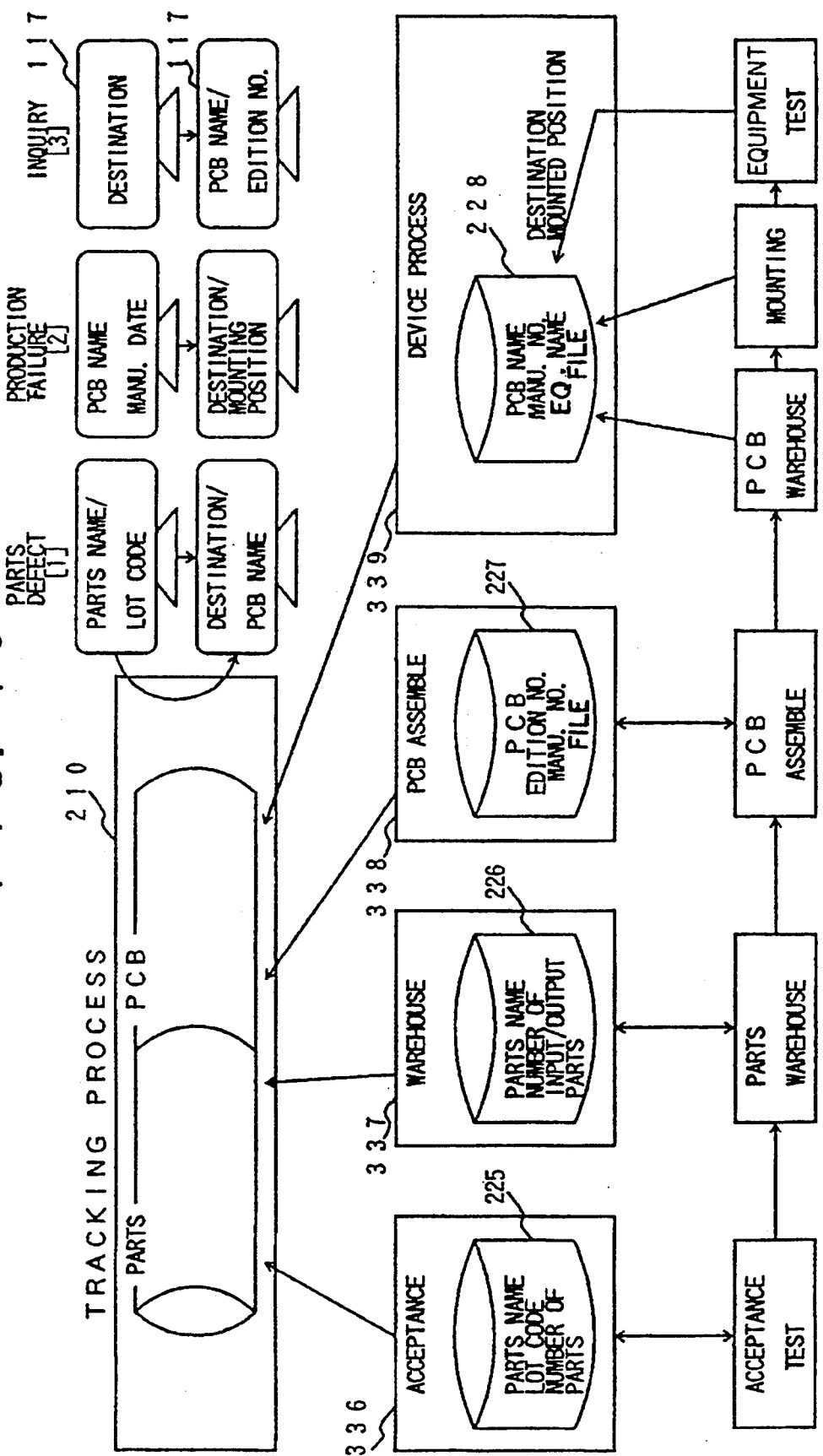
FIG. 19 is a block diagram showing an outline of a system operation of the second embodiment of the present invention.

The tracking procaps part 210 shown in FIG. 19 searches the data files 225-228 in response to a request from the terminal equipment 117, in order to search for necessary data. The necessary data is then output to for the terminal equipment 117. For example, data showing the parts name and lot code of defective parts are input via the terminal equipment 117, as indicated by [1]shown in FIG. 19. The tracking processing part 210 searches the related data files, and obtains the name of the printed-circuit boards having the defective parts and the destination of delivery to which the equipments having the above printed-circuit boards have been shipped. The name of the printed-circuit boards the destination of delivery are displayed on the display unit of the terminal equipment 117 and/or may be printed out by the printer 118.

During the above process, the tracking processing part 210 reads out, from the related data files, the number and warehouse date for parts having the lot code being considered, the number of delivered parts, the assembly number and so on, and accesses the data files 227 and 228 by referring to the readout data, For each of the printed-circuit boards using the defective parts, the tracking processing part 210 reads out, from these data files, the manufacturer's part number, the edition number, and the manufacture date of the printed-circuit boards of interest, the equipment name, the destination name of delivery and the mounting positions. In this manner, it is possible to identify the name of the printed-circuit boards having defective parts as well as the destination name of delivery.

As indicated by [2]shown in FIG. 19, if the name and manufacture date of defective printed-circuit boards are defined, the tracking processing part 210 searches for data on the destination of delivery and the mounting positions of the defective printed-circuit boards. When an inquiry about the destination of delivery is input from the terminal equipment 117, as indicated by [3]shown in FIG. 19 (for example, when an operator wishes to known the edition number of each printed-circuit board used in the delivered equipments), the tracking processing part 210 searches the data file 228, and reads the edition number of each printed-circuit board used in the delivered equipments. The result of this search is displayed on the terminal equipment 117.

Figures 20, 21:
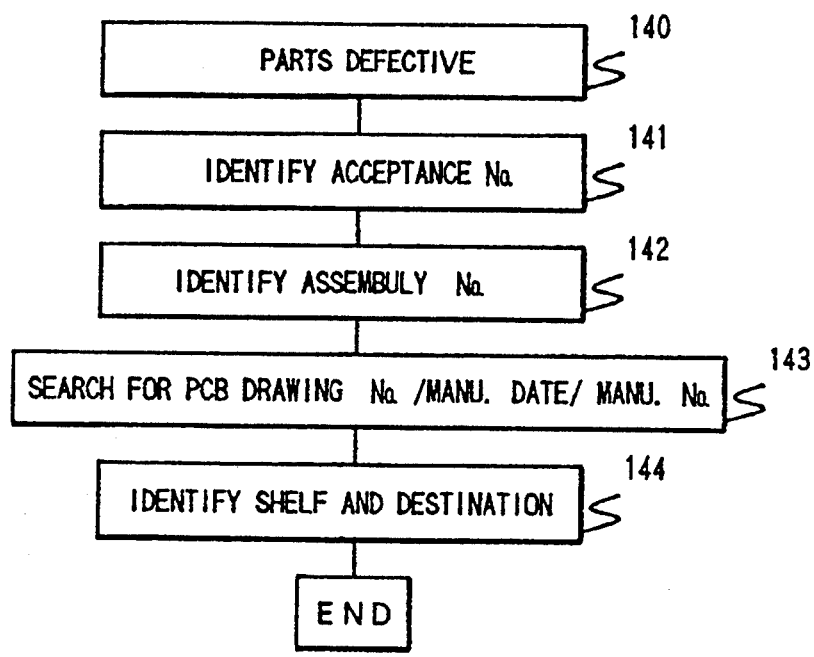
FIG. 20 is a flowchart of a process of investigating a lot failure extended range.
FIG. 21 is a diagram showing an example of data obtained by carrying out the process shown in FIG. 20.

FIG. 20 is a flowchart of a process for investigating a lot failure extended range; FIG. 21 shows an example of displayed, data obtained by the above investigating process. FIGS. 22A, 22B, 22C and 22D show examples of input data used in the investigating process. At step 140 shown in FIG. 20, it is confirmed that a lot failure has occurred in parts identified by parts code "IC11" and lot code "901A00". At step 141, the acceptance number of the parts being considered is searched for in the data file 225. FIG. 22(A) shows an example of parts acceptance data stored in the data file 225. As shown, the parts acceptance data shows the parts name, the accepted date, the number of accepted parts, the acceptance number and the lot code. In the parts acceptance data shown in FIG. 22(A) shows that the acceptance number is "PA01".

By referring to the data file 226 shown in FIG. 19, step 142 checks the relationship between the acceptance number of the parts of interest and the assembly number with which the parts were delivered. FIG. 22(B) shows an example of parts warehoused and delivered data stored in the data file 226. As shown, the parts warehoused and delivered data shows the parts name, the warehoused date, the delivered date, the number of warehoused parts, the number of delivered parts, the acceptance number and the assembly number. It can be seen from FIG. 22(B) that the assembly number having acceptance number "PA01" is "NG00001NA". At step 143, the printed-circuit board drawing number, the manufacturing date, and the manufacturing serial number (assigned to an identical type printed-circuit board) relating to the assembly number of interest are obtained by referring to data indicative of the printed-circuit board manufacturing step stored in the data base 227. FIG. 22(D) shows an example of the printed-circuit manufacturing step data. The data shown in FIG. 22(D) include assembly number "NG00001NA", and the related printed-circuit board drawing number (E20B-4514-R000), the manufacturing date (9012), and the manufacturing serial number (0001).

AT step 144, by referring to the mounting history data file 228 shown in FIG. 18, the shelves in which the printed-circuit boards of interest are installed, and the destination of delivery are searched for. FIG. 22(C) shows an example of the mounting history data. By referring to the mounting history data, it is possible to obtain information about the shelves in which the printed-circuit board of interest are installed as well as the destination of delivery (for example, an exchange station).

The results of the above retrieval are stored in the tracking data file 230 shown in FIG. 18, and displayed on the display unit of the terminal equipment(s) 117. In the above-mentioned manner, the lot failure extended range can be automatically identified at a high speed.

Figure 23A:
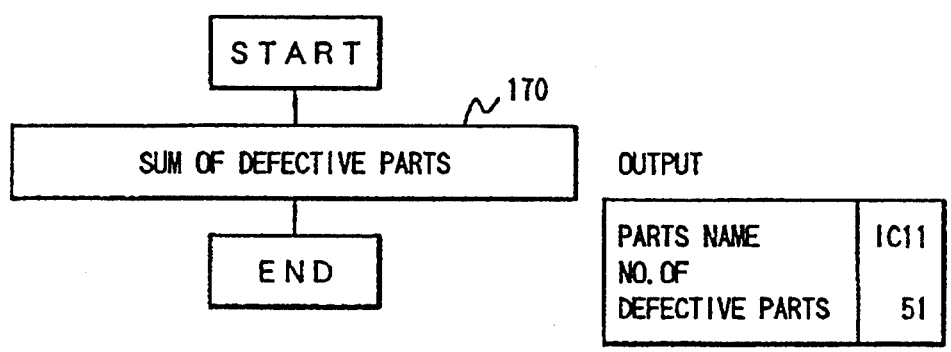
FIGS. 23A, 23B and 24 are flowcharts of the operation of the second embodiment of the present invention.
Figure 23B:
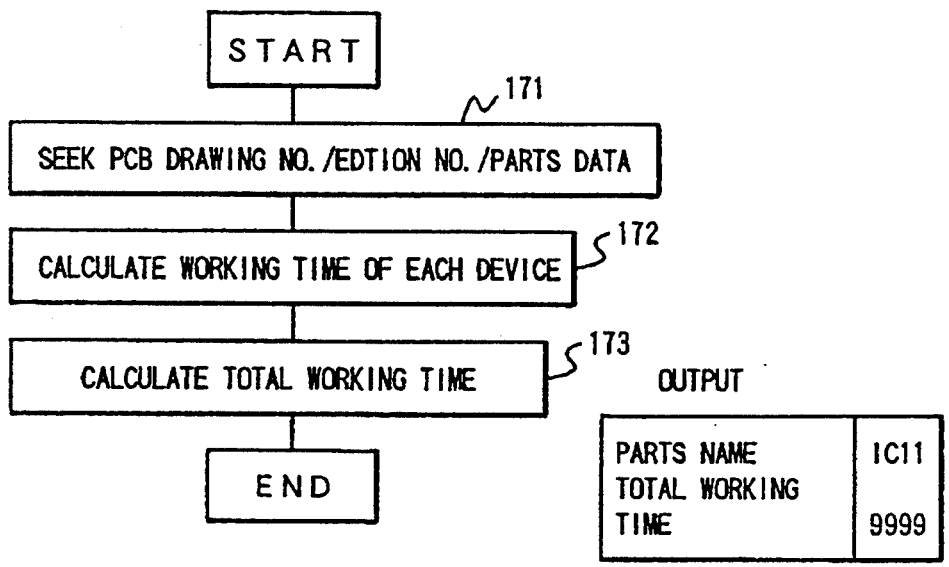
Figures 24, 25:
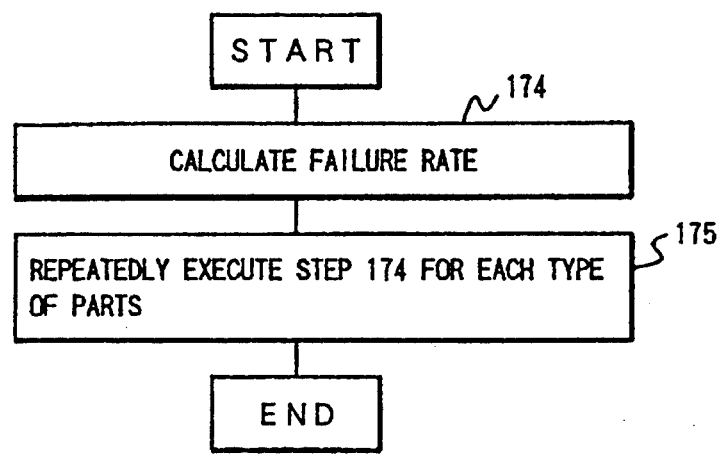
FIG. 25 is a diagram showing an example of displayed output data obtained by the process shown in FIGS. 23A, 23B and 24.

FIG. 23A, 23B and 24 are flowcharts of a process of calculating the failure rate, and FIG. 25 shows an example of the results of the failure rate calculation. FIGS. 26A, 26B and 26C show example of input data used in the failure rate calculation processes shown in FIG. 23A and FIG. 24.

FIG. 23A shows a process of obtaining the number of defective parts. The process shown in FIG. 23A is executed for each of the different types of parts. At step 170 shown in FIG. 23A, the number of parts is calculated for each of the different types of parts. FIG. 26(A) shows an example of the field failure data, which is failure data showing a failure which has occurred on the customer's side to which the equipment has been delivered. The field failure data contains information about the name of the printed-circuit board in which a failure has occurred, the drawing number, the edition number, and the number of the printed-circuit boards used in the equipment in addition to the destination in which the equipment has been installed, shelf information, the parts name and so on. In the example shown in FIGS. 26A–26C the name of the defective parts is "IC11". The total number M of the defective Parts having the parts name "IC11" is calculated. In the example shown in FIG. 23A, M=51.

FIG. 23B shows a process of calculating the total working time of parts. At step 171 shown in FIG. 23B, the mounting history data file 228 is accessed, and the printed-circuit board drawing number, the edition number and structural parts data of the printed-circuit board of interest are read out therefrom. FIG. 26(B) shows an example of the mounting history data, and FIG. 26(C) shows a parts list having parts data that are keyboarded, for example. The drawing number of the edition number of the parts being considered (IC11) are read from the parts list shown in FIG. 26(C), and data about the printed-circuit board being considered is read out from the mounting history data by referring to the parts name, the drawing number and the edition number thereof.

At step 172 shown in FIG. 23B, the total number of the identical structural parts being used is calculated, and the working times thereof are respectively calculated from the date of delivery and the present time. The total number of the structural parts can be calculated from the parts list shown in FIG. 26(C) and the mounting history data shown in FIG. 26(B). The date of delivery is stored in the mounting history data. Further, the sum total (component hour) of the working times of the identical structure al parts is calculated at step 173. In the example shown in FIG. 23B, the total working time of the parts having the name "IC11" is 9999.

At step 174 shown in FIG. 24, the number of the defective parts obtained at step 170 shown in FIG. 23A is divided by the total working time obtained at step 173. The result of this division is the failure rate. The step 174 is repeatedly carried out for each of the different types of structural parts.

In the above-mentioned manner, by referring to the field failure data, it becomes possible to easily obtain the failure rate for each of the different types of structural parts and the failure rate for each of the different types of printed-circuit boards and to shortly identify the lot failure extended range.

Further, the failure rate can be used in design of next products. Furthermore, it becomes possible to calculate a reference for calculating an appropriate number of stocked parts at the end of the life time of a product and a modification in the parts acceptance process. Since the lot failure extended range can be easily identified, it is possible to rapidly replace the defective elements with new elements. Hence, it becomes possible to provide the customers with improved services.

The present invention is not limited to the specifically disclosed embodiments, and variations and modifications may be made without departing from the scope of the present invention.

What is claimed is:

1. A system for automatically managing information about printed-circuit boards, comprising:

first data file means for storing stock information about the printed-circuit boards stocked in a warehouse, mounting information about mounting positions of the printed-circuit boards on shelves of equipments, and mounting history information about results of mounting of the printed-circuit boards;

delivery processing means, coupled to said data file means, for detecting, by referring to said stock information stored in said data file means, that all printed-circuit boards necessary to assembly an ordered equipment are available and for generating a delivery instruction for instructing that all the printed-circuit boards are to be delivered from the warehouse to a mounting section;

mounting processing means, coupled to said data file means and said delivery processing means, for outputting to said mounting section a mounting instruction for instructing that the printed-circuit boards delivered from the warehouse are to be placed in predetermined positions in said ordered equipment by referring to said mounting information stored in said data file means;

mounting history information gathering means, coupled to said mounting processing means, for gathering the mounting history information about the printed-circuit boards placed in the predetermined positions;

output means, coupled to said data file means for outputting at least said mounting history information to an output equipment;

tracking process means for managing quality information; and second data file means, coupled to said tracking process means for managing quality information, for storing, under control of said tracking process means for managing quality information, information about names, lot codes and numbers of accepted parts to be mounted on the printed-circuit boards, delivery information about parts delivered from a parts warehouse, assembling information about parts mounted on the printed-circuit boards obtained from a warehouse for assembled printed-circuit boards, information about results of an assembling process to determine whether or not an assembled printed-circuit board is defective and is to be replaced, and information about manufacturers of parts and destinations of delivery of the printed-circuit boards;

said tracking process means for managing quality information searching data files from said second data file means to determine, for each defective printed-circuit board, information about manufacturers of the printed-circuit board and parts mounted thereon and information about destinations of delivery to which the printed-circuit boards have been shipped.

2. A system as claimed in claim 1, wherein said system further comprises shipping list creating means for creating a shipping list of the equipments on the basis of the mounting history information stored in the data file means.

3. A system as claimed in claim 1, wherein said system further comprises:
   a change-of-design data file means for storing data indicative of a change of design of a printed circuit board; and
   shipping decision means for determining, by referring to the data indicative of the change of design and a mounting history data file, whether or not each of the equipments should be an equipment to which the change of design has been implemented and for allowing each of the equipments to be shipped only when it is determined that each of the equipments is an equipment to which the change of design has been implemented.

4. A system as claimed in claim 1, wherein said system further comprises:
   input means, coupled to said data file means, for inputting field failure data to said data file means, said field failure data comprising data indicative of a failure which has occurred in at least one of the equipments which have been shipped; and
   identifying means, coupled to said data file means, for identifying equipments relating to said failure on the basis of the field failure data stored in the data file means.

5. A system as claimed in claim 4, wherein said identifying means comprises:
   first means for identifying a type of a printed-circuit board in which said failure has occurred on the basis of the field failure data stored in said data file means; and
   second means, coupled to said first means, for identifying all printed-circuit boards of said type.

6. A system as claimed in claim 5, wherein said identifying means comprise third means, coupled to said data file means and said second means, for identifying a destination of delivery to which equipments having the printed-circuit boards of said type have been shipped by referring to said mounting history information and the printed-circuit boards of said type identified by said second means.

7. A system as claimed in claim 5, wherein said system further comprises failure rate generating means, coupled to said data file means and said input means, for generating a failure rate of a number of structural parts having failures to a total number of structural parts of said type.

8. A system as claimed in claim 4, wherein said identifying means comprises:
   first means for identifying a type of structural parts in which said failure has occurred on the basis of the field failure data stored in said data file means; and
   second means, coupled to said first means, for identifying all printed-circuit boards having said type of structural parts.

9. A system as claimed in claim 8, wherein said identifying means comprise third means, coupled to said data file means and said second means, for identifying a destination of delivery to which equipments having the printed-circuit boards having said type of structure1 parts have been shipped by referring to said mounting history information and said type of structural parts identified by said second means.

10. A system as claimed in claim 4, wherein said system further comprises failure rate generating means, coupled to said data file means and said input means, for generating a failure rate of a number of printed-circuit boards having failures to a total number of printed-circuit boards of said type.

11. A system as claimed in claim 1, and further comprising display means, coupled to said tracking process means for managing quality information, for displaying results of said search.

* * * * *